(12) United States Patent
Viswanathan et al.

(10) Patent No.: US 7,901,976 B1
(45) Date of Patent: Mar. 8, 2011

(54) METHOD OF FORMING BORDERLESS CONTACTS

(75) Inventors: Sriram Viswanathan, Chanhassen, MN (US); Vinay Krishna, Apple Valley, MN (US); Peter Keswick, Bloomington, MN (US); Daniel Amzen, Eden Prairie, MN (US)

(73) Assignee: Cypress Semiconductor Corporation, San Jose, CA (US)

( * ) Notice: Subject to any disclaimer, the term of this patent is extended or adjusted under 35 U.S.C. 154(b) by 136 days.

(21) Appl. No.: 11/803,474

(22) Filed: May 15, 2007

Related U.S. Application Data

(60) Provisional application No. 60/801,451, filed on May 18, 2006.

(51) Int. Cl.
*H01L 21/00* (2006.01)

(52) U.S. Cl. .................................. 438/98; 257/E31.11

(58) Field of Classification Search .................. 257/258, 257/291, 293, 294, E31.11; 438/637–640, 438/667, 98
See application file for complete search history.

(56) References Cited

U.S. PATENT DOCUMENTS

| | | | |
|---|---|---|---|
| 5,604,374 A | 2/1997 | Inou et al. | |
| 5,840,624 A | 11/1998 | Jang et al. | |
| 5,858,875 A | 1/1999 | Chung et al. | |
| 6,020,258 A | 2/2000 | Yew et al. | |
| 6,071,773 A | 6/2000 | Lee et al. | |
| 6,121,129 A * | 9/2000 | Greco et al. | 438/622 |
| 6,136,682 A | 10/2000 | Hegde et al. | |
| 6,137,126 A * | 10/2000 | Avanzino et al. | 257/288 |
| 6,228,761 B1 | 5/2001 | Ngo et al. | |
| 6,232,209 B1 | 5/2001 | Fujiwara et al. | |
| 6,255,700 B1 | 7/2001 | Yoshida et al. | |
| 6,309,971 B1 | 10/2001 | Geha | |
| 6,395,619 B2 | 5/2002 | Tanigami et al. | |
| 6,406,987 B1 | 6/2002 | Huang | |
| 6,436,850 B1 | 8/2002 | Morales | |
| 6,448,140 B1 | 9/2002 | Liaw | |
| 6,465,341 B1 | 10/2002 | Pramanick | |
| 6,673,686 B1 * | 1/2004 | Scholz et al. | 438/302 |
| 6,774,033 B1 * | 8/2004 | Ben-Tzur et al. | 438/643 |
| 6,784,474 B2 * | 8/2004 | Ogawa et al. | 257/295 |
| 6,806,177 B2 | 10/2004 | Strane et al. | |
| 6,809,027 B2 | 10/2004 | Strane et al. | |
| 6,911,395 B1 | 6/2005 | Qiao et al. | |
| 6,979,640 B1 * | 12/2005 | Blosse et al. | 438/634 |
| 2003/0230771 A1 * | 12/2003 | Lee | 257/226 |

(Continued)

OTHER PUBLICATIONS

Wolf S. & Tauber, R.N. Siliocn Processing for the VLSI Era: vol. 1—Process Technology. 2000. Lattice Press. p. 284.*

(Continued)

*Primary Examiner* — Matthew S Smith
*Assistant Examiner* — Daniel Shook

(57) ABSTRACT

A method is provided for forming a borderless contact to a local interconnect (LI) line on a substrate. Generally, the method includes steps of (i) depositing a nitride layer over a number of LI lines on the substrate, to substantially cover the LI lines; (ii) etching the nitride layer to form spacers adjacent to sidewalls of at least one of the number of LI lines and to expose at least a portion of a top surface of the LI line; (iii) depositing an inter-layer dielectric, such as an oxide, over the number of LI lines on the substrate and the spacers formed adjacent thereto; and (iv) performing a contact etch to etch contact openings through the inter-layer dielectric to expose the portion of the top surface of the underlying LI line. Other embodiments are also disclosed.

15 Claims, 4 Drawing Sheets

U.S. PATENT DOCUMENTS

2004/0241945 A1* 12/2004 Abbott .......................... 438/275

OTHER PUBLICATIONS

USPTO Notice of Allowance for U.S. Appl. No. 10/287,258 dated Mar. 17, 2004; 4 pages.
USPTO Requirement for Restriction/Election for U.S. Appl. No. 10/287,258 dated Sep. 17, 2003; 8 pages.
USPTO Notice of Allowance for U.S. Appl. No. 10/112,572 dated Aug. 1, 2005; 4 pages.
USPTO Advisory Action for U.S. Appl. No. 10/112,572 dated May 26, 2005; 3 pages.
USPTO Final Rejection for U.S. Appl. No. 10/112,572 dated Jan. 7, 2005; 14 pages.
USPTO Non-Final Rejection for U.S. Appl. No. 10/112,572 dated May 14, 2004; 17 pages.
USPTO Requirement for Restriction/Election for U.S. Appl. No. 10/112,572 dated Jan. 8, 2004; 5 pages.
USPTO Notice of Allowance for U.S. Appl. No. 09/668,604 dated Feb. 14, 2005; 7 pages.
USPTO Non-Final Rejection for U.S. Appl. No. 09/668,604 dated Sep. 21, 2004; 10 pages.
Kirk-Othmer, "Encyclopedia of Chemical Technology," 1998, 14:677-709; 35 pages.
Peter Van Zant, "Microchip Fabrication: A Practical Guide to Semiconductor Processing," 2000, 3rd Ed., Chapter 16, pp. 491-527; 39 pages.

* cited by examiner

METHOD OF FORMING BORDERLESS CONTACTS

CROSS-REFERENCE TO RELATED APPLICATIONS

The present application claims the benefit of priority under 35 U.S.C. 119(e) to U.S. Provisional Patent Application Ser. No. 60/801,451, filed on May 18, 2006 entitled Method Of Forming Borderless Contacts; which application is hereby incorporated by reference.

TECHNICAL FIELD

This invention pertains generally to methods of fabricating semiconductor devices, and more particularly to a method of forming borderless contacts through dielectric or insulating layers to stop on an underlying conductive structure.

BACKGROUND OF THE INVENTION

Developments in semiconductor processing in recent years have steadily decreased the size of features or elements in semiconductor devices such as integrated circuits (ICs), thereby increasing the speed of the devices.

As the size of transistors is reduced, a limiting factor in the device speed is resistive-capacitive (RC) delay associated with electrically conducting/insulating interconnect structures. In particular, as IC technology continues to scale, the aspect ratio of metal lines increases and the intra-level line-to-line capacitance increasingly dominates over the inter-level capacitance.

One approach to reducing the RC delay involves depositing nitride around metal, local interconnect (LI) lines within a layer to reduce intra-level capacitance, while using another dielectric material, such as silicon dioxide ($SiO_2$), to insulate the inter-level conducting layers. Subsequently, the inter-layer dielectric is patterned and etched to form vertical, borderless contacts or vias to the LI lines. By 'borderless contact' it is meant a metal, typically Tungsten (W), plug that makes contact with an underlying LI line without the use of a landing. That is, the borderless contact descends to an underlying structure that is no bigger in cross-section or diameter than the contact itself.

An example of a conventional interconnect structure formed on a substrate 100 using this approach is shown in FIGS. 1A and 1B. Referring to FIGS. 1A and 1B, a conventional method of forming a borderless contact begins with: (i) depositing a nitride 102 around local interconnect metal lines 104; (ii) covering the nitride with an inter-metal dielectric 106 (typically an oxide such as $SiO_2$); and (iii) performing a contact etch to etch the inter-metal dielectric, followed by etching the nitride to expose the underlying LI line forming a contact opening 108.

The conventional approach or technology to forming borderless contact suffers from a number of difficulties or disadvantages. One disadvantage is that the contact etch itself is complex. Requiring an oxide etch selective to nitride to etch the inter-metal dielectric 106, followed by a nitride etch selective to oxide to expose the metal line 104. Etch chemistries and processes for etching oxide while stopping on nitride results in the formation of polymer deposits, which must be removed prior to the nitride etch. These deposits are removed either in-situ, that is in the same chamber or tool in which the contact etch is performed, or ex-situ in a separate chamber or tool. In-situ cleans are undesirable in that they impact chamber condition to the detriment of other processes performed in the chamber. Ex-situ cleans are also undesirable in that they require breaking vacuum and additional processing steps following the contact etch, slowing the fabrication of the devices or Fab throughput.

Another disadvantage of the conventional approach is that the high aspect ratio of openings in the nitride 102 between LI lines 104 results in problems with subsequent oxide 106 fill.

FIG. 1C is a diagram illustrating an electron microscope image of a sectional side view of a portion of a device formed on a substrate 110 showing a borderless contact 112 formed using a conventional method and extending through an inter-metal dielectric 114 to one of a number of LI lines 116. Referring to FIG. 1C it is seen that yet another disadvantage of the conventional approach is that nitride etch typically requires an overetch, which frequently results in the formation of a 'tooth' 118 on one or more sides of the LI lines 116, which may not fill during contact metal deposition, voids 120.

Accordingly, there is a need for a method or process of forming borderless contacts to underlying LI lines that eliminates the need for an in-situ clean during or following the contact etch. There is a further need for a process that substantially eliminates problems with oxide fill, and 'tooth' formation due to nitride overetch.

The present invention provides a solution to these and other problems, and offers further advantages over conventional processes.

BRIEF DESCRIPTION OF THE DRAWINGS

These and various other features and advantages of the present invention will be apparent upon reading of the following detailed description in conjunction with the accompanying drawings and the appended claims provided below, where:

DETAILED DESCRIPTION

The present invention is directed generally to methods of forming borderless contacts through dielectric or insulating layers to stop on an underlying conductive structure.

In the following description, for purposes of explanation, numerous specific details are set forth in order to provide a thorough understanding of the present invention. It will be evident, however, to one skilled in the art that the present invention may be practiced without these specific details. In other instances, well-known structures, and techniques are not shown in detail or are shown in block diagram form in order to avoid unnecessarily obscuring an understanding of this description.

Reference in the description to "one embodiment" or "an embodiment" means that a particular feature, structure, or characteristic described in connection with the embodiment is included in at least one embodiment of the invention. The appearances of the phrase "one embodiment" in various places in the specification do not necessarily all refer to the same embodiment.

Briefly, the present invention involves depositing a layer of a first dielectric material over raised, conductive structures on a substrate or wafer. The substrate with the first dielectric layer thereon is then blanket etched to form spacers of the first dielectric material adjacent to sidewalls of the conductive structures and expose a top surface of the conductive structures. An inter-metal or inter-layer dielectric (ILD) layer of a second dielectric material is then deposited, and contact holes or openings patterned and etched through the ILD layer using an etch process highly selective to the second dielectric material relative to the first. The contact openings are subsequently filled with a metal plug to form vias or vertical, borderless contacts, which make contact with an underlying conductive structure without the use of a landing.

The method of the present invention is particularly useful for forming borderless contacts to contacts through an ILD layer to an underlying local interconnect (LI) line.

Methods for fabricating a borderless contact to a LI line according to various embodiments of the present invention will now be described in greater detail with reference to FIGS. 2A through 2D.

Figure 2A:
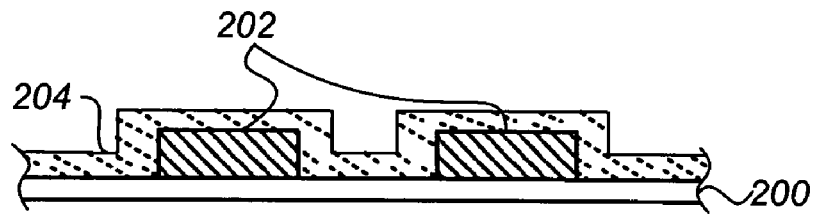
FIGS. 2A-D are block diagrams of cross-sectional side view of a pair of LI lines formed on a substrate and illustrate a method of forming a borderless contact according to an embodiment of the present invention.

FIG. 2A shows a cross-sectional side view of a pair of LI lines 202 formed on a semiconductor wafer or substrate 200 and covered with a conformal first dielectric layer 204. The semiconductor substrate 200 may include any conventionally known semiconductor material, such as Silicon, Gallium-arsenide, Germanium, Gallium-nitride, Aluminum-phosphide, and alloys thereof. Preferably, the substrate 200 is a doped or undoped Silicon wafer. The LI lines 202 may be formed from one or more conductive (or semiconductive) materials. For example, an LI line 202 may include a first metal, such as aluminum, copper, titanium (Ti), tungsten or alloys thereof, covered by a titanium or titanium-nitride (TiN) barrier layer. The conformal first dielectric layer 204 may be a nitride layer of the form $Si_xN_y$, such as SiN or $Si_3N_4$, having a thickness of from about 200 to about 1000 angstroms (Å). The nitride layer may be formed or deposited, for example, by Low Pressure Chemical Vapor Deposition (LPCVD), Plasma Enhanced Chemical Vapor Deposition (PECVD) or Atomic Layer Deposition (ALD).

Figure 2B:
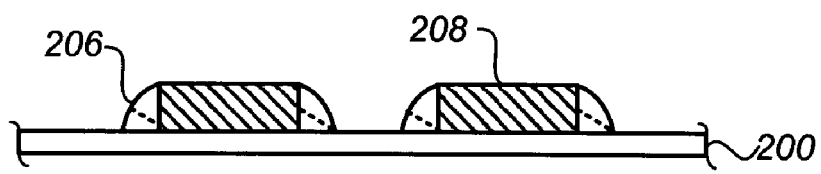

Next, referring to FIG. 2B the nitride layer or first dielectric layer 204 is blanket or spacer etched to form spacers 206 adjacent to sidewalls of the LI lines 202 and to expose at least a portion of a top surface 208 of the lines. The use of spacers 206 in general, the use of nitride spacers in particular, covering only the sidewalls of the LI lines 202 provide numerous advantage over conventional borderless contacts and methods of forming the same. First, the sloped shape of the spacers 206 simplifies and enables a more uniform deposition of the subsequently formed ILD layer (not shown in FIG. 2B). Second, the use of nitride spacers 206 covering only the sidewalls of the LI lines 202, while leaving the top surface 208 of the lines substantially exposed, eliminates the need for a nitride etch during the subsequent contact etch, thereby minimizing or preventing entirely 'tooth' formation. Third, the use of spacers 206, as opposed to the elimination of the first dielectric layer altogether, substantially eliminates sidewall loss of the LI lines 202, particularly the sidewall loss of Ti/TiN LI lines, due to oxidation in the subsequent formation of an oxide ILD layer. Finally, the use of nitride spacers 206 around the metal LI lines 202 can reduce interconnect parallel plate capacitance between adjacent LI lines due to removal of some or substantially all of the high K material of the ILD layer (not shown in FIG. 2B) from between the lines.

Preferably, the blanket etching also substantially removes the nitride layer or first dielectric layer 204 from a surface of the substrate 200 between the spacers 206. Removing the nitride layer or first dielectric layer 204 from between the spacers 206 is desirable to reduce optical reflectance of the device or die, and to reduce the overall stack height of the die.

The blanket etch may be accomplished or performed in a number of different ways including, for example, low pressure etching at a moderate power (about 500 W) in a plasma of a fluorine containing gas, such as $CF_4$, or $CHF_3$. A block diagram illustrating a cross-sectional side view of the LI lines 202 of FIG. 2A following spacer etch of the nitride layer 204 to form the spacers 206 is shown in FIG. 2B.

Figure 2C:
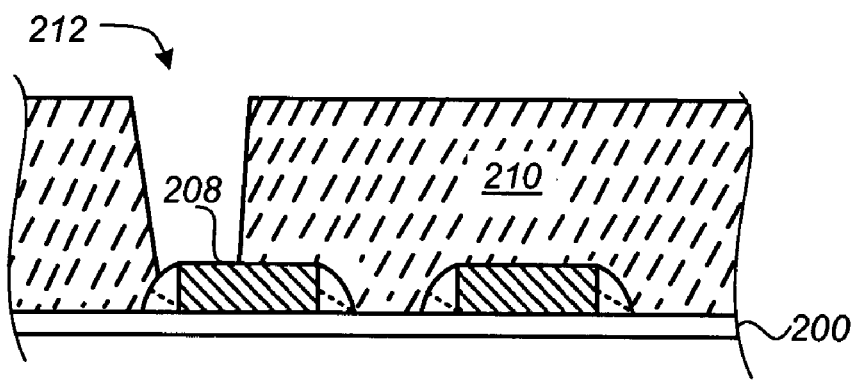

Referring to FIG. 2C an ILD layer 210 of a second dielectric material is then deposited, and contact holes or openings 212 patterned and etched through the ILD layer using an etch process highly selective to nitride. The second dielectric material may be an oxide, such as silicon dioxide ($SiO_2$), having a thickness of from about 1000 to about 6000 Å. The oxide layer may be formed in a number of ways including, for example, being thermally grown in a low pressure (100-200 mTorr) oxygen containing atmosphere. The contact openings 212 may be patterned and etched using a number of known photolithographic and etching techniques. For example, the oxide 210 can be etched using, for example, plasma at a pressure of about 30 mTorr, at a power of 500 W, and using a suitable etchant gas. One suitable gas composition includes $CO/C_4F_8/Ar$. Because the etch stops substantially on the exposed, underlying LI line 208 and not on a nitride layer, formation of polymer deposits does not affect contact resistance as it is removed in a subsequent post-etch clean, which is a standard process/procedure performed ex-situ.

Figure 2D:
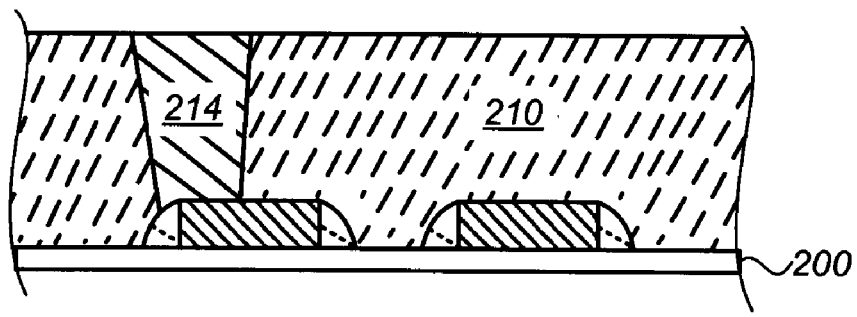

The contact openings 212 is then filled with a plug of one or more conductive materials including, for example, one or more metals such as aluminum, copper, Ti, W or alloys thereof, to form a borderless contact. The borderless contact may be formed using any known metal deposition technique including, for example, by sputtering, evaporation, CVD or ALD. A block diagram illustrating a cross-sectional side view of the structure of FIG. 2C following filling of the contact opening 212 to form a borderless contact 214 is shown in FIG. 2D.

Figure 3:
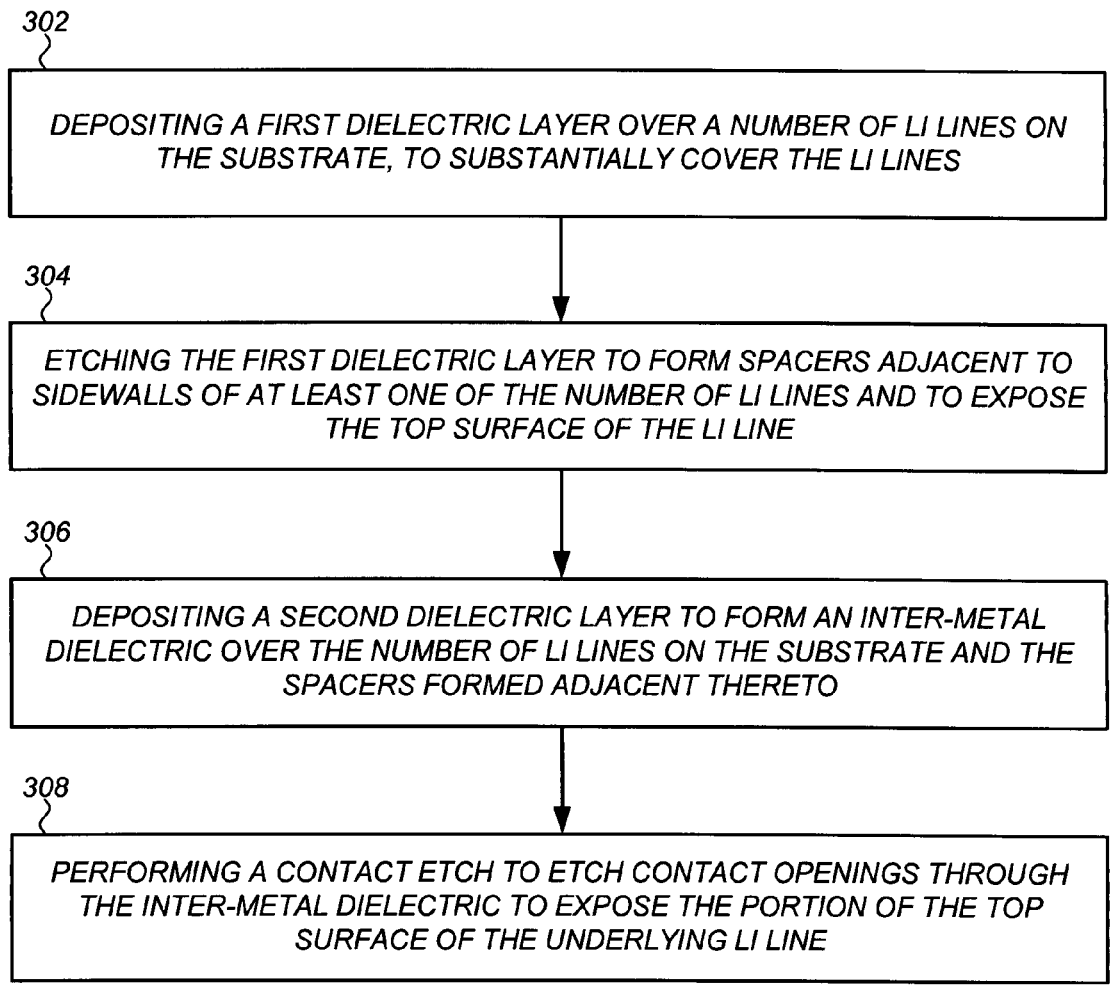
FIG. 3 is a flowchart of a method of forming a borderless contact according to an embodiment of the present invention.

A method of forming a borderless contact to a local interconnect (LI) line on a substrate according to a preferred embodiment of the present invention will now be summarized with reference to the flowchart of FIG. 3. Referring to FIG. 3, the method generally includes steps of (i) depositing a nitride layer over a number of LI lines on the substrate, to substantially cover the LI lines (step 302); (ii) etching the nitride layer to form spacers adjacent to sidewalls of at least one of the number of LI lines and to expose the top surface of the LI line (step 304); (iii) depositing an inter-layer dielectric, such as an oxide, over the number of LI lines on the substrate and the spacers formed adjacent thereto (step 306); and (iv) performing a contact etch to etch contact openings through the inter-layer dielectric to expose the portion of the top surface of the underlying LI line (step 308).

Figure 1A:
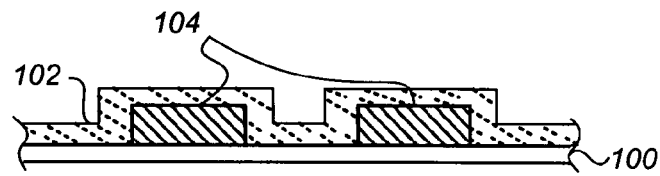
FIG. 1A (prior art) is a block diagram illustrating a cross-sectional side view of a pair of local interconnect (LI) lines formed on a substrate and covered with a conformal nitride according to a conventional method.
Figure 1B:
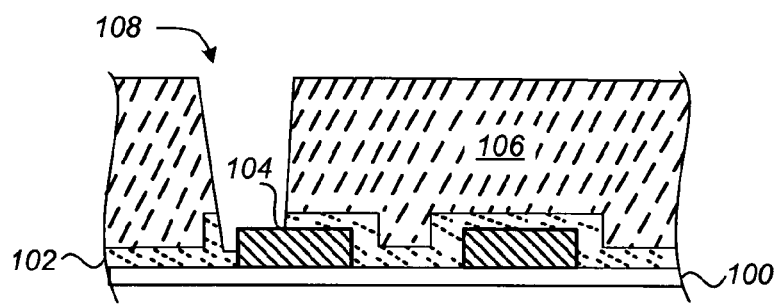
FIG. 1B (prior art) is a block diagram illustrating a cross-sectional side view of the LI lines of FIG. 1A covered with an oxide inter-layer dielectric and having a contact opening etched or formed therein using a conventional method.
Figure 1C:
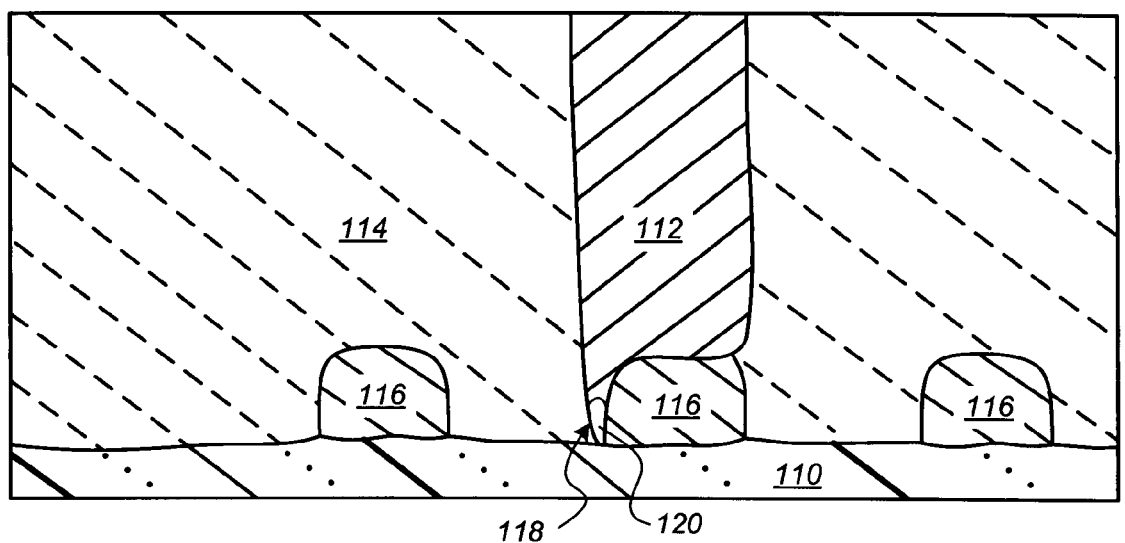
FIG. 1C (prior art) is a diagram illustrating an electron microscope image of a sectional side view of a portion of a substrate showing a borderless contact formed using a conventional method.
Figure 4:
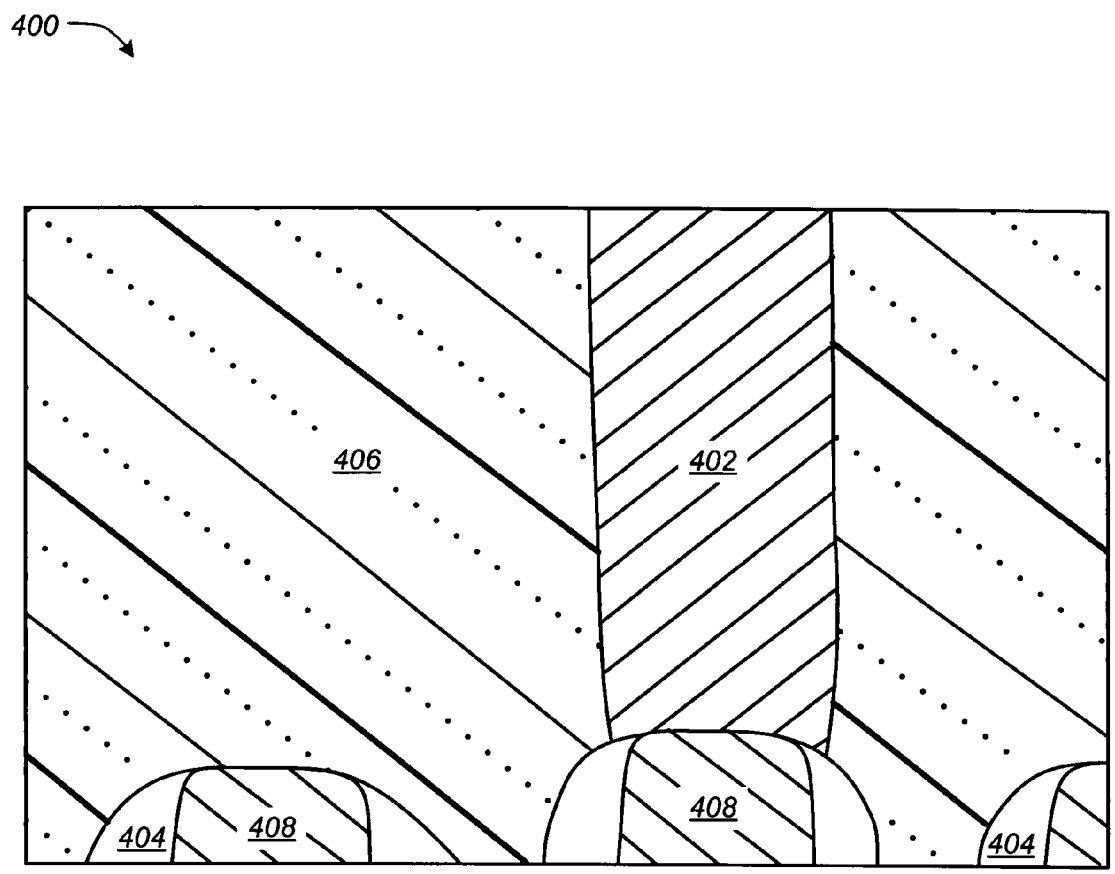
FIG. 4 is a diagram illustrating an electron microscope image of a sectional side view of a portion of a substrate showing a borderless contact formed using a method according to an embodiment of the present invention.

A diagram illustrating an electron microscope image of a sectional side view of a portion of a substrate 400 showing a borderless contact 402 formed through a first, nitride dielectric layer 404 and a second, oxide ILD layer 406 to a LI line 408 using the above method is shown in FIG. 4. Comparing the image of FIG. 4 to that of FIG. 1C, it is seen that borderless contact 402 formed according to the method of the present invention does not exhibit the problems with oxide fill, and 'tooth' 118 formation due to nitride overetch common to conventionally formed contacts 112.

The advantages of the method of the present invention over previous or conventional approaches include: (i) eliminates need for an in-situ cleans during the contact etch, thereby improving yield (ii) slope on spacer facilitates subsequent oxide deposition substantially eliminating problems with oxide fill due to high aspect ratio openings in the nitride layer; (iii) substantially eliminates 'tooth' formation due to nitride overetch by eliminating nitride etch during the contact etch; (iv) relaxed overlay requirements between the borderless contact and LI metal lines; (v) reduces the overall stack height of the die; and (vi) removes nitride film from places where it is not needed, which is particularly useful in applications requiring reduced reflectance, such as in image sensors.

The foregoing description of specific embodiments and examples of the invention have been presented for the purpose of illustration and description, and although the invention has been described and illustrated by certain of the preceding examples, it is not to be construed as being limited thereby. They are not intended to be exhaustive or to limit the invention to the precise forms disclosed, and many modifications, improvements and variations within the scope of the invention are possible in light of the above teaching. It is intended that the scope of the invention encompass the generic area as herein disclosed, and by the claims appended hereto and their equivalents. The scope of the present invention is defined by the claims, which includes known equivalents and unforeseeable equivalents at the time of filing of this application.

What is claimed is:

1. A method of forming an image sensor comprising:
    depositing a layer of conductive material comprising titanium (TI) on a surface of a substrate and patterning the layer to form a number of local interconnect (LI) lines;
    depositing a first dielectric material including silicon nitride over the number of LI lines on the substrate, to substantially cover the LI lines;
    etching the first dielectric material to form spacers adjacent to sidewalls of at least one of the number of LI lines, to expose at least a portion of a top surface of the LI line and to remove the silicon nitride from the surface of the substrate between the spacers to reduce optical reflectance from the sensor; and
    forming a silicon oxide layer over the spacers and the number of LI lines to form an inter-layer dielectric (ILD) over the spacers and the number of LI lines, wherein the spacers formed adjacent to sidewalls of the LI lines minimize sidewall loss due to oxidation during deposition of the ILD.

2. A method of forming an image sensor comprising:
    depositing a layer of conductive material comprising titanium (TI) on a substrate and patterning the layer to form a number of local interconnect (LI) lines including a titanium-nitride (TiN) barrier layer;
    depositing a first dielectric layer including a silicon nitride layer over the number of LI lines on the substrate, to substantially cover the LI lines;
    etching the first dielectric layer to form spacers adjacent to sidewalls of at least one of the number of LI lines, to expose at least a portion of a top surface of the LI line and to remove the silicon nitride layer from the surface of the substrate between the spacers to reduce optical reflectance from the sensor;
    depositing a silicon oxide layer to form an inter-layer dielectric (ILD) over the spacers and the number of LI lines, wherein the spacers formed adjacent to sidewalls of the LI lines minimize sidewall loss due to oxidation during deposition of the ILD;
    performing a contact etch to etch a contact opening through the ILD exposing the portion of the top surface of the LI line; and
    filling the contact opening with a conductive material comprising tungsten (W) to form a contact to the LI line.

3. A method of forming an image sensor comprising:
    depositing a layer of conductive material comprising titanium (TI) on a surface of a substrate and patterning the layer to form a number of local interconnect (LI) lines;
    depositing a silicon nitride layer over the number of LI lines on the substrate;
    etching the silicon nitride layer to form spacers adjacent to sidewalls of at least one of the number of LI lines and to expose at least a portion of a top surface of the LI line; and
    forming a silicon oxide layer over the surface of the substrate to form an inter-layer dielectric (ILD) over the number of LI lines, wherein the spacers formed adjacent to sidewalls of the LI lines minimize sidewall loss due to oxidation during deposition of the ILD;
    performing a contact etch to etch a contact opening through the ILD exposing the portion of the top surface of the LI line; and
    filling the contact opening with a conductive material comprising tungsten (W) to form a contact to the LI line.

4. A method according to claim 1, wherein the etching the first dielectric material to form spacers, comprises etching the first dielectric material to form spacers having a sloped cross-section extending from a top of the LI line sidewalls down to the surface of the substrate on which the LI line is formed.

5. A method according to claim 1, wherein the number of LI lines comprise a titanium-nitride (TiN) barrier layer.

6. A method according to claim 1, wherein the first dielectric layer comprises a thickness of from about 200 to about 1000 angstroms (Å).

7. A method according to claim 1, wherein the silicon oxide layer is thermally grown in a low pressure (100-200 mTorr) atmosphere comprising oxygen.

8. A method according to claim 6, wherein the thickness of the first dielectric layer is selected to form spacers that reduce interconnect parallel plate capacitance between adjacent LI lines.

9. A method according to claim 2, wherein the spacers formed adjacent to sidewalls of the LI lines reduce capacitive coupling between adjacent LI lines.

10. A method according to claim 2, wherein the contact is a borderless contact formed without use of a landing and having a cross-section no larger than the LI line.

11. A method according to claim 2, wherein the first dielectric layer comprises a thickness of from about 200 to about 1000 angstroms (Å).

12. A method according to claim 10, wherein the thickness of the first dielectric layer is selected to form spacers that reduce interconnect parallel plate capacitance between adjacent LI lines.

13. A method according to claim 3, wherein etching the silicon nitride layer to form spacers comprises substantially removing the nitride layer from the surface of the substrate between the spacers to reduces optical reflectance from the image sensor.

14. A method according to claim 3, wherein the contact is a borderless contact formed without use of a landing and having a cross-section no larger than the LI line.

15. A method according to claim 3, wherein the silicon nitride layer comprises a thickness of from about 200 to about 1000 angstroms (Å) selected to form spacers that reduce interconnect parallel plate capacitance between adjacent LI lines.

* * * * *